UNIJUNCTION TRANSISTOR OSCILLATOR CIRCUIT

Filed March 25, 1963

JOHN R. ANDERSON
INVENTOR.
BY Samuel Lindenberg
ATTORNEY

United States Patent Office 3,202,937

Patented Aug. 24, 1965

3,202,937

UNIJUNCTION TRANSISTOR OSCILLATOR CIRCUIT

John R. Anderson, 26279 Taaffe, Los Altos, Calif.

Filed Mar. 25, 1963, Ser. No. 267,406
2 Claims. (Cl. 331—111)

This invention relates to unijunction transistor circuits and more particularly to improvements therein.

The unijunction transistor is used in a number of different types of oscillator circuits such as sawtooth generators, multivibrators, etc. In a basic and typical relaxation oscillator circuit used with these circuits the unijunction emitter is connected between a resistor and capacitor which are connected in series. A voltage is applied across this resistor and capacitor and another voltage is applied between the two bases of the unijunction transistor. There is no conduction between the two bases of the unijunction transistor until the capacitor is charged up to a sufficiently high voltage level to bias the unijunction transistor into conduction.

It will be apparent that the frequency of operation of this oscillator is directly affected by the value of the charging resistance in series with the capacitance. The leakage current of the unijunction transistor operates to change the effective value of this charging resistance so that the oscillator will not oscillate at the frequency which is calculated on the basis of the values of the components selected. Furthermore, since variations in the temperature in the unijunction transistor do cause variations in the emitter leakage current, this oscillator will vary considerably with temperature variations. One way of compensating for the effects of the emitter leakage current is to make the value of the charging resistance as large as possible when compared to the emitter leakage resistance to reduce the emitter leakage current. Since typical values for the emitter leakage resistance can vary from ½ megohm to 6 megohms, and since such variations are induced by temperature variations, the arrangement is not a very satisfactory one.

Accordingly, an object of this invention is to provide a stabilized unijunction transistor oscillator circuit of the type described.

Another object of the present invention is the provision of a novel stabilized unijunction transistor oscillator circuit.

Yet another object of the present invention is the provision of a novel, useful, simple arrangement for stabilizing a unijunction transistor oscillator circuit.

These and other objects of this invention may be achieved by connecting a Zener diode between the junction of the charging resistance and capacitor and the emitter of the unijunction transistor. With this structure isolation is achieved between the emitter of the unijunction transistor and the capacitor and the resistor employed for charging it. As a result, the charging resistor may be given reasonable values, and neither temperature variations of the unijunction transistor nor emitter leakage current variations affect the frequency of oscillation.

The novel features that are considered characteristic of this invention are set forth with particularity in the appended claims. The invention itself both as to its organization and method of operation, as well as additional objects and advantages thereof, will best be understood from the following description when read in connection with the accompanying drawings, in which:

Figure 1:
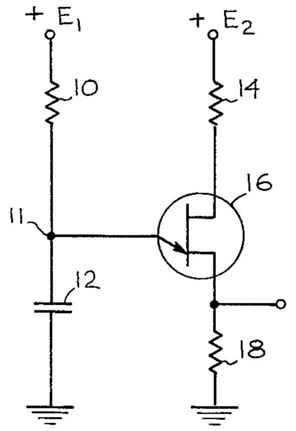
Fig. 1 PRIOR ART
FIGURE 1 is a typical unijunction relaxation oscillator circuit of the type over which this invention is an improvement.

FIGURE 1 is a circuit diagram of a basic relaxation oscillator circuit which is used for many applications. It usually includes a series connected resistor 10, and capacitor 12. These are connected to a first source of operating potential $E_1$. A resistor 14 is connected to a second source of operating potential $E_2$. The resistor connects to the second base of a unijunction transistor 16. The first base of the unijunction transistor is connected through a resistor 18 to ground. The emitter of the unijunction transistor 16 is connected to the junction of capacitor 12 and resistor 10. Output from the circuit is usually taken at the junction of the first base with resistor 18.

As previously indicated, the leakage current between the emitter and the first base adversely affects the stability of the relaxation oscillator provided by this circuit. Since the temperature variations of the unijunction transistor also cause variations of the leakage current, the frequency of oscillation is also adversely affected by these temperature variations.

Figure 2:
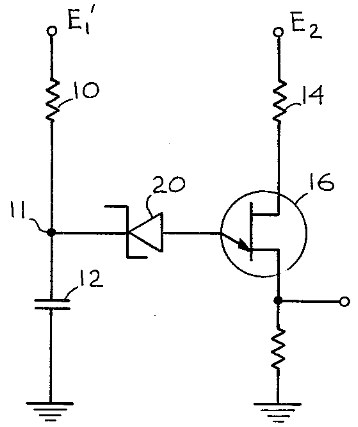
FIGURE 2 is a circuit diagram of an embodiment of this invention.

FIGURE 2 is a circuit diagram illustrating the improvement afforded by this invention whereby the undesirable effects of the emitter leakage current can be virtually eliminated. Instead of the emitter of the unijunction transistor 16 being directly connected to the junction between the resistor 10 and the capacitor 12, it is connected to a Zener diode 20, which in turn is connected to the junction between the resistor and capacitor. The Zener diode as is well known is a diode which possesses a very high back resistance up to its critical reverse voltage breakdown, or Zener voltage. At this point, the back resistance drops to a very small value. In this region, the current will increase very rapidly while the voltage drop across the diode remains almost constant.

Assume that the breakdown voltage of the Zener diode may be designated as $V_z$. Preferably this should be in the range of from 6.5 to 8.5 volts to take advantage of a low temperature coefficient type of diode. The voltage $E_1$ which is applied across the resistor and capacitor must now be increased to $E_1'$ which equals $E_1$ plus $V_z$. It is also desirable to keep $V_z$ as low as possible. The dynamic impedance of the Zener diode is also lower for low values of $V_z$.

During the time that the capacitor 12 is charging through the resistance 10, the junction point 11 between them will be virtually an open circuit since the impedance of the Zener diode may be nearly 100 megohms before the breakdown of the Zener diode occurs. Variation in $V_e$ which is the emitter saturation voltage of the unijunction transistor, will also have less effect on frequency since, with the Zener diode in the circuit the triggering voltage required is the sum of the Zener diode breakdown voltage $V_z$ plus $V_e$ the voltage applied to the emitter to enable conduction between bases, rather than $V_e$ alone, as is the case with the conventional circuit of FIGURE 1. If $V_z$ approximately equals $V_e$, then the effects of variation in the value of $V_e$ may be reduced by one half.

Figure 3:
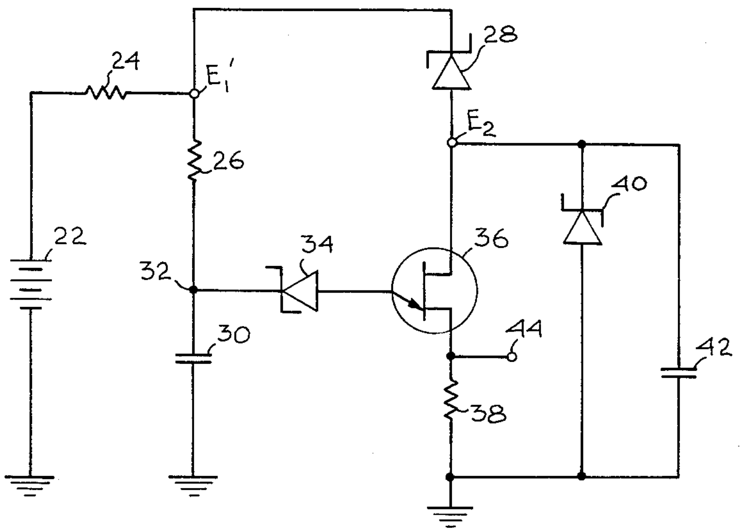
FIGURE 3 is a circuit diagram of another embodiment of this invention.

It is desirable to use stabilized voltages for $E_1'$ and $E_2$. One convenient way of obtaining such stabilization from a single source of operating potential 22, is shown in FIGURE 3. The operating potential source 22, is connected through a resistor 24 to the junction of a second resistor 26 and a Zener diode 28. A capacitor 30 is connected between resistor 26 and ground. The junction 32, of resistor 26 and capacitor 30 is connected through a Zener diode 34 to the emitter of a unijunction transistor 36. The second base of this unijunction transistor is connected to the Zener diode 28 and the first base is connected through a resistor 38 to ground. A third Zener diode 40, is connected between the second base of the unijunction transistor 36 and ground. A capacitor 42 is connected between the second base of the unijunction transistor and ground also.

It will be seen that the Zener diode 34 serves the identical function as was described for the Zener diode 20 in FIGURE 2. The addition of the Zener diode 28 between the junction of resistors 24 and 26 and the second base of the unijunction transistor is for the purpose of reducing the emitter reverse current of the unijunction transistor, that is the current that flows between the emitter and second base, nearly to zero, due to the blocking effect of the Zener diode 28. The interbase current is also nearly zero except when the charge across capacitor 30 is sufficiently high to fire the unijunction transistor.

The combination of resistor 24, Zener diode 28 and Zener diode 40 serves to series regulate the voltage $E_1'$ which is across the resistor 26 and capacitor 30. The voltage $E_2$ which is across the unijunction transistor is regulated by the operation of the combination of Zener diode 40 and capacitor 42. If desired, a resistor such as the resistor 14, may be inserted between the Zener diode 28 and the second base of the unijunction transistor. This can assist in stabilizing the operation of the circuit.

Output can be taken either from the output terminal 44 which is connected to the first base of the unijunction transistor or from the second base of the unijunction transistor. However, it is preferable to take such output from the first base so that the load will have no shunting effect on the unijunction transistor. In an embodiment of the invention which was built, by way of illustration, not by way of limitation, the capacitor 42 had a value on the order of 5 microfarads. The recommended breakdown voltages for the Zener diode 28 is on the same order as that for Zener diode 34, or 20, and the breakdown voltage for Zener diode 40 may be between 10 and 30 volts. The remainder of the circuit may be designed in accordance with the information found in, for example, the transistor manual published by General Electric, Sixth Edition, 1962.

There has accordingly been shown and described herein a novel, useful and improved relaxation oscillator circuit using unijunction transistors. Its operation stability is such as to enable its use wherever a precision oscillator is required.

I claim:

1. An improved relaxation oscillator circuit of the type wherein a unijunction transistor having an emitter and a first and second base electrode is connected to the junction between a first resistor and capacitor across which the voltage for charging said capacitor is applied, said improvement comprising first, second and third means, each having a relatively high resistance to reverse current flow therethrough until a predetermined voltage is exceeded when the resistance is relatively low, means connecting said first means between the emitter of said unijunction transistor and the junction between said first resistor and capacitor, means connecting said second means between the second base of said unijunction transistor and the end of said first resistor which is connected to said voltage for charging said capacitor, a second resistor connected between said first base and the end of said capacitor which is not connected to said first resistor and means connecting said third means between said second base and the end of said capacitor which is not connected to said first resistor.

2. A relaxation oscillator circuit including a unijunction transistor having emitter, first and second base electrodes, a first resistor, a second resistor connected in series with said first resistor, a first capacitor connected in series with said second resistor, a first Zener diode connected between said emitter and the connection between said second resistor and said first capacitor, a second Zener diode connected between said second base and the connection between said first and second resistors, a third resistor connected between said first base and the end of said first capacitor which is not connected to said second resistor, a third Zener diode connected between said second base and the end of said first capacitor which is not connected to said second resistor, a second capacitor connected across said third Zener diode, and means for applying operating potential across said first and second resistors and said first capacitor.

References Cited by the Examiner

UNITED STATES PATENTS 2,947,916 8/60 Beck ---------------- 307—88.5

OTHER REFERENCES

Silicon Zener Diode and Rectifier Handbook by Motorola, Inc., 2nd ed., copyright 1961, pp. 73, 110, 11.

ROY LAKE, *Primary Examiner.*

JOHN KOMINSKI, *Examiner.*